United States Patent
Kong et al.

(10) Patent No.: US 11,699,073 B2
(45) Date of Patent: *Jul. 11, 2023

(54) NETWORK OFF-LINE MODEL PROCESSING METHOD, ARTIFICIAL INTELLIGENCE PROCESSING DEVICE AND RELATED PRODUCTS

(71) Applicant: Cambricon Technologies Corporation Limited, Beijing (CN)

(72) Inventors: Weiguang Kong, Beijing (CN); Yaling Huang, Beijing (CN); Jin Wang, Beijing (CN)

(73) Assignee: CAMBRICON TECHNOLOGIES CORPORATION LIMITED, Beijing (CN)

(*) Notice: Subject to any disclaimer, the term of this patent is extended or adjusted under 35 U.S.C. 154(b) by 722 days.

This patent is subject to a terminal disclaimer.

(21) Appl. No.: 16/711,279

(22) Filed: Dec. 11, 2019

(65) Prior Publication Data
US 2020/0210829 A1    Jul. 2, 2020

(30) Foreign Application Priority Data
Dec. 29, 2018    (CN) .......................... 201811646109.7

(51) Int. Cl.
*G06N 3/08*    (2023.01)
*G06N 3/063*    (2023.01)
(Continued)

(52) U.S. Cl.
CPC .............. *G06N 3/08* (2013.01); *G06F 30/27* (2020.01); *G06N 3/02* (2013.01); *G06N 3/04* (2013.01);
(Continued)

(58) Field of Classification Search
CPC .. G06N 3/08; G06N 3/02; G06N 3/04; G06N 3/063; G06N 3/105; G06N 3/0454;
(Continued)

(56) References Cited

U.S. PATENT DOCUMENTS 10,785,296 B1 * 9/2020 Allison ............... H04L 67/1095
11,159,790 B2 * 10/2021 Xu ....................... H04N 19/117
(Continued)

FOREIGN PATENT DOCUMENTS

CN        103533609 A        1/2014
CN        105095765 A        11/2015
(Continued)

OTHER PUBLICATIONS

Hongshan Jiang 等: "Parallelization of module network structure learning and performance tuning on SMP", <<Proceedings 20th IEEE International Parallel & Distributed Processing Symposium>> , 2006 (Year: 2006).*
(Continued)

*Primary Examiner* — Andrae S Allison
(74) *Attorney, Agent, or Firm* — Getech Law LLC; Jun Ye

(57) ABSTRACT

The present disclosure provides a network off-line model processing method, an artificial intelligence processing device and related products, where the related products include a combined processing device. The combined processing device includes the artificial intelligence processing device, a general-purpose interconnection interface, and other processing devices, where the artificial intelligence processing device interacts with the other processing devices to jointly complete computation designated by users. The embodiments of the present disclosure can accelerate the operation of the network off-line model.

8 Claims, 2 Drawing Sheets obtaining the information of the operating unit of each sub-network in the network off-line model, where the information of the operating unit includes the correspondence between the sub-network and the type of the operating unit, and the type of the operating unit includes the general-purpose processing unit type or the AI processing unit type — S101 defining the operating parameters of the sub-network according to the information of the operating unit when the network off-line model is being constructed to obtain the constructed network off-line model, where the operating parameters of the sub-network are used to represent the type of the operating unit of each sub-network — S102

(51) Int. Cl.
   *G06N 3/04* (2023.01)
   *H04L 12/18* (2006.01)
   *G16Y 30/00* (2020.01)
   *H04L 67/12* (2022.01)
   *G06F 30/27* (2020.01)
   *G06N 3/02* (2006.01)
   *G06N 3/10* (2006.01)

(52) U.S. Cl.
   CPC .............. *G06N 3/063* (2013.01); *G06N 3/105* (2013.01); *G16Y 30/00* (2020.01); *H04L 12/189* (2013.01); *H04L 12/1886* (2013.01); *H04L 67/12* (2013.01)

(58) Field of Classification Search
   CPC ....... G06N 20/00; G06F 30/27; G06F 9/4482; G16Y 30/00; H04L 12/1886; H04L 12/189; H04L 67/12
   See application file for complete search history.

(56) References Cited

U.S. PATENT DOCUMENTS

| | | | | |
|---|---|---|---|---|
| 11,314,507 | B2* | 4/2022 | Liu | G06F 9/44505 |
| 2009/0282386 | A1* | 11/2009 | Moir | G06F 9/466 |
| | | | | 717/106 |
| 2010/0077386 | A1* | 3/2010 | Akkiraju | G06F 8/36 |
| | | | | 717/136 |
| 2012/0016816 | A1 | 1/2012 | Yanase et al. | |
| 2018/0034924 | A1* | 2/2018 | Horwood | H04L 67/34 |
| 2018/0247180 | A1 | 8/2018 | Cheng et al. | |
| 2018/0365562 | A1 | 12/2018 | Volkova | |
| 2020/0005219 | A1* | 1/2020 | Stevens | G06F 8/71 |
| 2020/0104129 | A1* | 4/2020 | Liu | G06F 9/44505 |
| 2021/0334137 | A1* | 10/2021 | Zhang | G06F 11/3644 |
| 2021/0350216 | A1* | 11/2021 | Yamamoto | G06N 3/063 |
| 2022/0129289 | A1* | 4/2022 | Chen | G06F 8/41 |

FOREIGN PATENT DOCUMENTS

| | | | |
|---|---|---|---|
| CN | 105184366 | A | 12/2015 |
| CN | 106155978 | A | 11/2016 |
| CN | 106156851 | A | 11/2016 |
| CN | 106610867 | A | 5/2017 |
| CN | 106650913 | A | 5/2017 |
| CN | 106886023 | A | 6/2017 |
| CN | 106992872 | A | 7/2017 |
| CN | 107292382 | A | 10/2017 |
| CN | 107480789 | A | 12/2017 |
| CN | 107579993 | A | 1/2018 |
| CN | 107844371 | A | 3/2018 |
| CN | 107979482 | A | 5/2018 |
| CN | 108037994 | A | 5/2018 |
| CN | 108229258 | A | 6/2018 |
| CN | 108288089 | A | 7/2018 |
| CN | 108319720 | A | 7/2018 |
| CN | 108615046 | A | 10/2018 |
| CN | 108694441 | A | 10/2018 |
| CN | 108776833 | A | 11/2018 |
| CN | 108805267 | A | 11/2018 |
| CN | 108921210 | A | 11/2018 |
| CN | 108985921 | A | 12/2018 |
| CN | 109032671 | A | 12/2018 |
| CN | 109034386 | A | 12/2018 |
| CN | 109063829 | A | 12/2018 |
| CN | 109754072 | A | 5/2019 |
| CN | 110110621 | A | 8/2019 |

OTHER PUBLICATIONS

Arash Firuzan et al.: ""Reconfigurable network-on-chip for 3D neural network accelerators"", <<NOCS ''18: Proceedings of the Twelfth IEEE/ACM International Symposium on Networks-on-Chip>> , 2018 (Year: 2018).*
CN201811570061—Notice of Grant, dated Jan. 14, 2021, 4 pages.
CN201811570061—First Office Action, dated Apr. 27, 2020, 8 pages.
CN201811570061—Second Office Action dated Sep. 28, 2020, 11 pages.
CN201811646109—First Office Action, dated Nov. 4, 2019, 20 pages.
CN201811646109—Notice of Grant, dated May 11, 2020, 4 pages.
CN201811646109—Second Office Action, dated Feb. 28, 2020, 8 pages.
CN201811654179—Decision of Rejection, dated May 8, 2020, 13 pages.
CN201811654179—First Office Action, dated Oct. 30, 2019, 27 pages.
CN201811654179—Second Office Action, dated Feb. 21, 2020, 27 pages.
PCT/CN2019/087631—International Search report and written Opinions, dated Sep. 19, 2019, 13 pages.

* cited by examiner

NETWORK OFF-LINE MODEL PROCESSING METHOD, ARTIFICIAL INTELLIGENCE PROCESSING DEVICE AND RELATED PRODUCTS

TECHNICAL FIELD

The disclosure relates generally to the field of information processing technologies, and more specifically to a network off-line model processing method, an artificial intelligence processing device and related products.

BACKGROUND

With the development of information technology and people's ever-growing needs, people have higher requirements for information timeliness. At present, obtaining and processing of information by the terminal is based on the processor. In practice, a processor processes information by running software programs, which is limited by the type of network model, that is, the processor is incompatible with the versions of some new network models. At present, the off-line network model operating on the processor is constructed under the machine framework. When the network model is being constructed, each layer of network is not differentiated, which results in a situation where a single processor cannot be compatible with various off-line network models.

SUMMARY

The embodiments of the present disclosure provide a processing method of off-line model, that is, when an off-line network is saved, a type identifier of the off-line network is saved, so that all types of off-line networks can be operated compatibly according to the type identifier.

A first aspect, the embodiments of the present disclosure provide a processing method of network off-line model, which includes:

obtaining information of an operating unit of each sub-network in the network off-line model, where the information of the operating unit includes a correspondence between the sub-network and a type of the operating unit, and the type of the operating unit includes a general-purpose processing unit type or an artificial intelligence (AI) processing unit type; and defining operating parameters of the sub-network according to the information of the operating unit when the network off-line model is being constructed to obtain the constructed network off-line model, where the operating parameters of the sub-network are used to represent the type of the operating unit of each sub-network.

A second aspect, the embodiments of the present disclosure provide an AI device of the off-line model, which includes:

an obtaining module configured to obtain information of the operating unit of each sub-network in the network off-line model, where the information of the operating unit includes the correspondence between the sub-network and the type of the operating unit, and the type of the operating unit includes the general-purpose processing unit type or the AI processing unit type; and a constructing module configured to define operating parameters of the sub-network according to the information of the operating unit when the network off-line model is being constructed to obtain the constructed network off-line model, where the operating parameters of the sub-network are used to represent the type of the operating unit of each sub-network.

A third aspect, the embodiments of the present disclosure provide a computing device including a memory and a processor, where the memory stores a computer program running on the processor, and the method of the first aspect can be implemented when the processor operates the computer program.

A fourth aspect, the embodiments of the present disclosure provide an ROM (readable storage medium), on which a computer program is stored. The method of the first aspect can be implemented when the processor operates the computer program.

A fifth aspect, the embodiments of the present disclosure provide a combined processing device including the AI processing device of the second aspect, a general-purpose interconnection interface, and other processing devices. The AI processing device interacts with the other processing devices to jointly complete computation designated by users.

It can be seen that, in the embodiments of the present disclosure, the information of the operating unit of the off-line network model is obtained; when the network off-line model is being constructed, the operating parameters of each sub-network are defined; and the type of the operating unit of each sub-network is marked in the operating parameters. By using the processing method of off-line model, the sub-networks of the off-line network model can be classified, so that each sub-network can be assigned to the corresponding processor for operation when the offline network model is running. In this way, the network off-line model can be operated compatibly and the type of the network off-line model that can be run on the AI processing device can be increased.

BRIEF DESCRIPTION OF THE DRAWINGS

In order to more clearly illustrate the technical solutions of the embodiments of the present disclosure, the drawings used in the embodiments will be briefly introduced below. Apparently, the described drawings are merely some rather than all drawings of the embodiments of the present disclosure, and all other drawings can be obtained by those of ordinary skill in the art based on the drawings of the present disclosure without creative efforts.

DETAILED DESCRIPTION OF THE EMBODIMENTS

The technical solutions in the embodiments of the present disclosure will be described clearly and in details hereinafter with reference to the accompanied drawings in the present disclosure. Apparently, the described embodiments are merely some rather than all embodiments of the present disclosure. All other embodiments obtained by those of ordinary skill in the art based on the embodiments of the present disclosure without creative efforts shall fall within the protection scope of the present disclosure.

The terms such as "first", "second", "third", "fourth" and the like in the specification, the claims, and the accompanied drawings of the present disclosure are configured for distinguishing between different objects rather than describing a particular order. The terms "include" and "comprise" as well as variations thereof are intended to cover non-exclusive inclusion. For example, a process or a method including a series of steps or a system, a product, a device, or an apparatus including a series of units is not limited to the listed steps or units, it may alternatively include other steps or units that are not listed; alternatively, other steps or units inherent to the process, method, product, or device may be included.

The term "embodiment" or "implementation" referred to herein means that a particular feature, structure, or characteristic described in conjunction with the embodiment may be contained in at least one embodiment of the present disclosure. The phrase appearing in various places in the specification does not necessarily refer to the same embodiment, nor does it refer to an independent or alternative embodiment that is mutually exclusive with other embodiments. It is expressly and implicitly understood by those skilled in the art that an embodiment described herein may be combined with other embodiments.

The AI processing device in the present disclosure may include a smart phone (such as an Android phone, an iOS phone, a Windows phone, etc.), a tablet, a palmtop, a laptop, an MID (Mobile Internet Device), or a wearable device. The above electronic devices are merely a non-exhaustive list of examples, and include, but are not limited to, the aforementioned AI processing devices.

Figure 1:
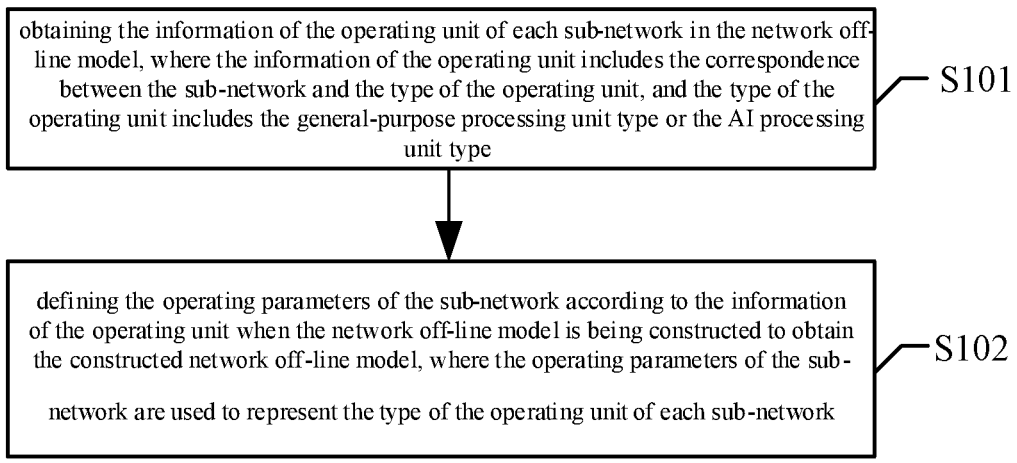
FIG. 1 is a flow chart of a processing method of a network off-line model provided by the embodiments of the present disclosure.

FIG. 1 is a flow chart of a processing method of a network off-line model provided by the embodiments of the present disclosure. The method is applied to the network off-line model which includes the general-purpose processor and the AI processor. The method includes the content as shown in steps S101 to S102:

step S101, obtaining the information of the operating unit of each sub-network in the network off-line model, where the information of the operating unit includes the correspondence between the sub-network and the type of the operating unit, and the type of the operating unit includes the general-purpose processing unit type or the AI processing unit type.

In some embodiments, if the operating unit of the sub-network is an AI processing unit, the information of the operating unit further includes information of an entry function of the sub-network. When the sub-network is being operated by the AI processing unit, the information of the entry function is used to call off-line instructions corresponding to the sub-network. The off-line instructions of some sub-networks are pre-complied, which could speed up the operating of the network off-line model.

In some embodiments, the general-purpose processor may include one or more of a CPU (Central Processing Unit), a GPU (Graphics Processing Unit), and/or an IPU (Image Processing Unit). The AI processor may include an MLU (Machine Learning Processing Unit), where the AI processor may be integrated by a plurality of MLUs to form an AI processor with multi-cores.

In some embodiments, before the information of the operating unit of each sub-network in the off-line network model is obtained, firstly, it is necessary to determine whether a plurality of network layers of the off-line network model can be fused. If the plurality of network layers of the off-line network model can be fused, the plurality of network layers that can be fused may be fused to one sub-network, and the network layers that cannot be fused may be used as a separate sub-network. After a fusion operation is performed on the network off-line model, several sub-networks of the network off-line model can be obtained. Therefore, each sub-network may be a separate network layer, or several network layers may be fused to a sub-network. For example, if the network off-line model includes a convolution layer, a normalization layer BatchNorm, and a scale layer, then the convolution layer, the normalization layer BatchNorm, and the scale layer in the network off-line model can be fused to a sub-network.

In some embodiments, after the network off-line model is fused, the information of the operating unit of each sub-network in the network off-line model is obtained to determine the type of the operating unit of each sub-network, so that when the network off-line model is being constructed, the type of the operating unit of each sub-network can be defined in a field corresponding to the type of the operating unit of the network The method further includes the content of step S102:

step S102, defining the operating parameters of the sub-network according to the information of the operating unit when the network off-line model is being constructed to obtain the constructed network off-line model, where the operating parameters of the sub-network are used to represent the type of the operating unit of each sub-network.

In some embodiments, the AI device uses a pre-installed machine learning framework to construct the network off-line model. In the following paragraphs, caffe (Convolutional Architecture for Fast Feature Embedding) is taken as an example to illustrate the construction of the network off-line model.

For the caffe framework, generating an off-line file requires two inputs, of which one is a prototxt file containing information of a network, and the other is a caffemodel file containing trained weights and biases. When generating an off-line file, caffe first calls an underlying library interface to create an off-line file, then caffe divides the entire input prototxt network into several sub-networks according to whether each layer of the prototxt network can be operated on the AI processor. If a sub-network can be operated on the AI processor, the caffe framework will call the underlying library interface to compile the sub-network into the off-line instructions that can be operated on the AI processor. And then, the caffe framework stores the generated off-line instructions in a pre-generated off-line file by calling the underlying library interface. At the same time, for layers that require weights such as a convolution layer and a full connection layer, caffe first reads out the weights and biases from the trained caffemodel and store them into a corresponding blob, where blob is a data structure defined in caffe, which is used to transfer data between layers. The weights and biases are be transmitted to the underlying library when caffe calls the underlying library to generate the off-line instructions, and then caffe calls a relevant interface of the underlying library to store the off-line instructions, the weights, and the biases into the off-line file together. When caffe calls the underlying library to compile the sub-network so as to generate the off-line instructions, caffe can specify how many cores the sub-network can be operated on, that is to specify a model parallelism, and the sub-network can be used as a model.

In addition to the off-line instructions, the weights, biases and other data, the off-line file also store information of customized units, where each sub-network corresponds to the information of a unit. The information of units can be generated by the protobuf mechanism. caffe can then call the relevant interface provided by protobuf to add the information of units to the end of the off-line file, so that the information can be used later to operate the off-line file.

Optionally, in some embodiments of the present disclosure, the information of units with the format as .SegmentInfoUnit can be pre-defined, which is used to store the operating parameters of each sub-network. The operating parameters of each sub-network include a name of the sub-network, a type of the operating unit, and parameter information of the sub-network, and the parameter information of the sub-network can be used to indicate resource scheduling of the processor during the execution of the sub-network. For example, the parameter information of the sub-network may include information of a convolution kernel, which can be used to represent resource information of the AI processing unit that needs to be scheduled to operate the sub-network.

Optionally, the information of units may also include index identifiers of the off-line instructions and index identifiers of computation parameters corresponding to each sub-network, where those index identifiers are used to read the off-line instructions and computation parameters corresponding to each sub-network from the off-line file. And then, the information of units may be added to the off-line file caffemodel, so that based on the index identifiers, the operating parameters of each sub-network, and the off-line instructions as well as the computation parameters corresponding to the sub-network can be read from the off-line file through the underlying interface of caffe.

In some embodiments, the computation parameters are parameters related to computation of each sub-network. For example, when the sub-network is a convolutional layer, the computation parameters are weights and biases. If the convolutional layer has no offset, the offset is zero. For another example, when the sub-network is an activation layer, the computation parameters are activation functions.

In some embodiments, a method of storing the operating parameters of each sub-network into a data structure corresponding to each sub-network may be as follows: obtaining a preset BP Message based on the Protocol Buffers mechanism; compiling fields that match the BP Message in a layer of each sub-network into a binary file through a compiler in the Protocol Buffers mechanism; and storing the binary file into a data structure with the format as .SegmentInfoUnit. Apparently, the Protocol Buffers mechanism is only an exemplary description, and the present disclosure does not limit the methods of storing the network information of the sub-network.

It can be seen that, in the embodiments of the present disclosure, a new method of storing the network off-line model is provided, that is, when the network off-line model is being constructed, the operating parameters of each sub-network are defined, so that the off-line file in the constructed off-line model can store the type of the operating unit of each sub-network. In addition, based on the types of the operating units of each stored sub-network, different network layers can be operated by different operating units. When there are new layers in the model, by flexibly specifying the operating units of the newly added layer, the operation of the network off-line model can be more flexible, and the network off-line model can be more compatible to various AI devices.

Figure 2:
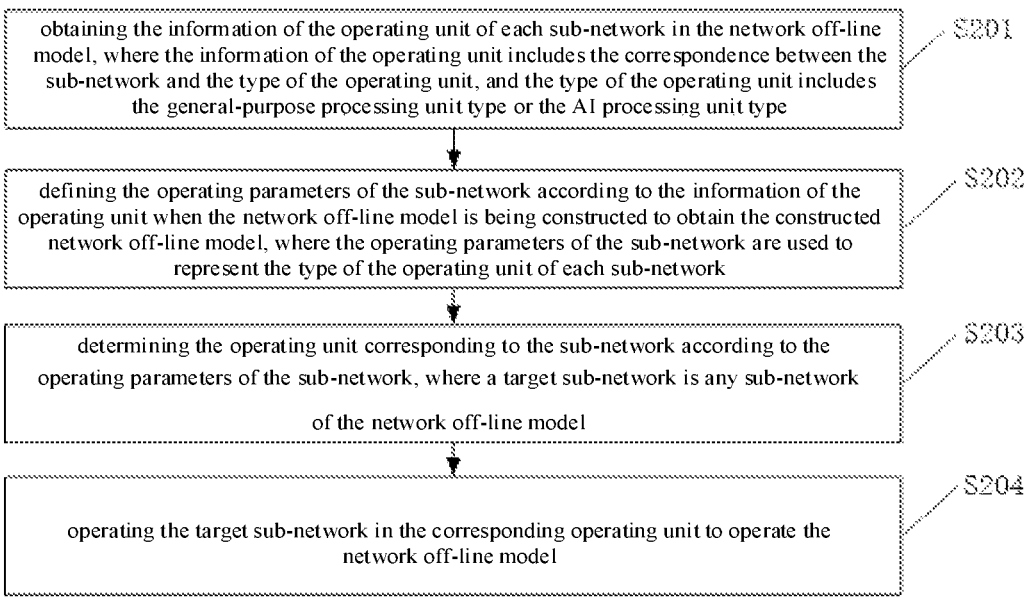
FIG. 2 is a flow chart of another processing method of a network off-line model provided by the embodiments of the present disclosure.

FIG. 2 is a flow chart of another processing method of a network off-line model provided by the embodiments of the present disclosure. The method is applied to an AI device, which includes a general-purpose processor and an AI processor. The method includes the content as shown in steps S201 to S204;

step S201, obtaining the information of the operating unit of each sub-network in the network off-line model, where the information of the operating unit includes the correspondence between the sub-network and the type of the operating unit, and the type of the operating unit includes the general-purpose processing unit type or the AI processing unit type;

step S202, defining the operating parameters of the sub-network according to the information of the operating unit when the network off-line model is being constructed to obtain the constructed network off-line model, where the operating parameters of the sub-network are used to represent the type of the operating unit of each sub-network;

step S203, determining the operating unit corresponding to a target sub-network according to the operating parameters of the sub-network, where the target sub-network is any sub-network of the network off-line model; and step S204, operating the target sub-network in the corresponding operating unit to operate the network off-line model.

Optionally, the process of operating the target sub-network in the corresponding operating unit is: traversing the data structure in a sequential order to read the operating parameters of the network off-line model through an interface of a machine learning framework, determining the operating unit that operates the target sub-network based on the operating parameters of the network, and determining the operating units of a previous sub-network and a next sub-network connected to the target sub-network, and then the process of forward-inference is completed. And then, the process of operating the target sub-network in the corresponding operating unit is: indicating the operating unit of the target sub-network to obtain input data from the operating unit of the previous sub-network, and transmitting the output result of the target sub-network as input data to the operating unit of the next sub-network. For example, if the operating unit type in the network operating parameters of the target sub-network is an AI processing unit type, the operating unit type of the previous sub-network is a general-purpose processing unit type, and the operating unit type of the next sub-network is a general-purpose processing unit type, then the process of operating the target sub-network in the corresponding operating unit is: indicating the AI processing unit to obtain data from the general-purpose processing unit, using the obtained data as input data, and transmitting the obtained output result to the general-purpose processing unit to complete the forward-inference process of the network off-line model, so that the network off-line model can be operated in sequence.

It can be seen that, in the embodiments of the present disclosure, the general-purpose processing unit and the AI processing unit are provided in the AI processing device. The operating unit of each sub-network is determined based on the operating parameters of each sub-network. Then, the corresponding operating unit operates the sub-network, so that if the AI processing unit does not support the operation of the sub-network, the general-purpose processing unit can complete the operation of the sub-network. In other words, the general-purpose processing unit and the AI processing unit may work together to operate all types of the network off-line model, so that the application scope of the network off-line model may be expanded. Besides, in the embodiments of the present disclosure, compared to operating all the network off-line models by the general-purpose processing unit, the AI processing unit operating some network layers that can be operated by the AI processing unit may accelerate the inference of the entire off-line network. In addition, generating the off-line instruction of the network layers which can be operated on the AI processing unit in advance can save the time of generating the off-line instructions while operating the network layers. Some or all operations of the network off-line models can be operated by the general-purpose processing unit, which can reduce the working pressure on the AI processing unit.

In a possible embodiment, the implementation process of determining the operating unit corresponding to the target sub-network according to the operating parameters of the sub-network may be: obtaining a model parallelism of the network off-line model; and determining the AI processing unit corresponding to the target sub-network according to a scheduling mechanism of the AI processing unit, the model parallelism, and the operating parameters of the sub-network.

In the possible embodiments, when determining the AI processing unit corresponding to the target sub-network, the off-line instruction corresponding to the target sub-network is read from the off-line file of the network off-line model, and the off-line instruction is parsed to obtain the model parallelism in the off-line instruction; according to the model parallelism, the number of AI processing units required to operate the target sub-network is obtained; the scheduling mechanism of the AI processing unit is obtained, and an appropriate number of processing units are allocated from the AI processor according to the scheduling mechanism; and the allocated AI processing units are designated as AI processing units operating the target sub-network, and the off-line instruction and computation parameters corresponding to the sub-network are distributed to the plurality of AI processing units to complete the operation of the target sub-network. In the embodiments of the present disclosure, the model parallelism of each sub-network can be set in advance. In other words, the number of the AI processing units required to operate the sub-network is specified, so that a multi-core AI processing unit can operate the corresponding operation of the sub-network on the AI processor, in this way, the operating speed of the sub-network can be improved.

In a possible embodiment, when each AI processing unit includes a plurality of processing threads, that is, when each AI processing unit includes a plurality of data transmission channels, the implementation process of operating the target sub-network on the corresponding operating unit to operate the network off-line model is: obtaining an interface instruction when the underlying library is called, parsing the interface instruction to obtain a channel identifier included in the interface instruction, determining the data transmission channel of the AI processing unit according to the channel identifier, and operating the target sub-network on the AI processing unit through the channel to operate the network off-line model. In the embodiments of the present disclosure, each target AI processing unit includes the plurality of data transmission channels. When the target sub-network calls the underlying library, the corresponding channel is specified by the interface instruction to transmit the off-line instruction and computation parameters to the target AI processing unit, thereby accelerating the reading and writing of the AI processing unit, so that the inference process of the net-work offline model can be accelerated.

Figure 3:
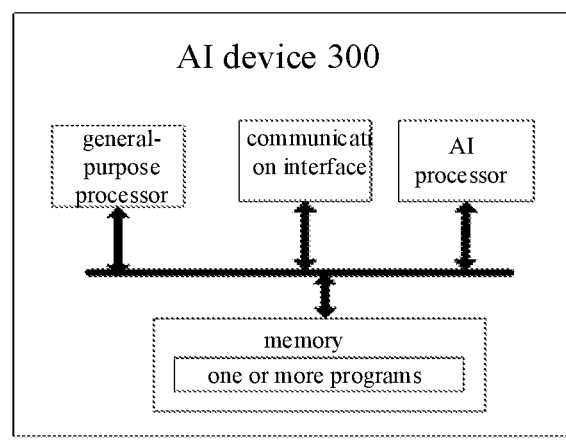
FIG. 3 is a structural diagram of an AI device of a network off-line model provided by the embodiments of the present disclosure.

FIG. 3 is a structural diagram of an AI device of a network off-line model provided by the embodiments of the present disclosure. As shown in FIG. 3, an AI device 300 includes a general-purpose processor, an AI processor, a memory, a communication interface, and one or more programs, where the one or more programs are different from the one or more application programs, and the one or more programs are stored in the memory and configured to be operated by the processors. The programs include the instructions of operating the following steps:

obtaining the information of the operating unit of each sub-network in the network off-line model, where the information of the operating unit includes the correspondence between the sub-network and the type of the operating unit, and the type of the operating unit includes the general-purpose processing unit type or the AI processing unit type; and defining the operating parameters of the sub-network according to the information of the operating unit when the network off-line model is being constructed to obtain the constructed network off-line model, where the operating parameters of the sub-network are used to represent the type of the operating unit of each sub-network.

The each sub-network includes a plurality of fused network layers; and the operating parameters of each sub-network include a name of the sub-network, the type of the operating unit, and the parameter information of the sub-network.

In a possible embodiment, the programs further include the instructions of operating the following steps:

operating the constructed network off-line model.

The programs specifically include the instructions of operating the following steps:

determining the operating unit corresponding to a target sub-network according to the operating parameters of the sub-network, where the target sub-network is any sub-network of the network off-line model; and operating the target sub-network on the corresponding operating unit to operate the network off-line model.

In a possible embodiment, if the operating unit corresponding to the target sub-network is the AI processing unit, when the step of determining the operating unit corresponding to the target sub-network according to the operating parameters of the sub-network is performed, the programs specifically include the instructions of operating the following steps:

obtaining the model parallelism of the network off-line model; and determining the AI processing unit corresponding to the target sub-network according to the scheduling mechanism of the AI processing unit, the model parallelism, and the operating parameters of the sub-network.

In a possible embodiment, if the operating unit corresponding to the target sub-network is the AI processing unit, the programs include the instructions of operating the target sub-network on the corresponding operating unit to operate the network off-line model, and the programs specifically include the instructions of operating the following steps:

when the underlying library interface is being called, obtaining a channel identifier transmitted from the underlying interface;

determining a channel of the AI processing unit for transmitting data according to the channel identifier; and operating the target sub-network on the AI processing unit through the channel to operate the network off-line model.

Figure 4:
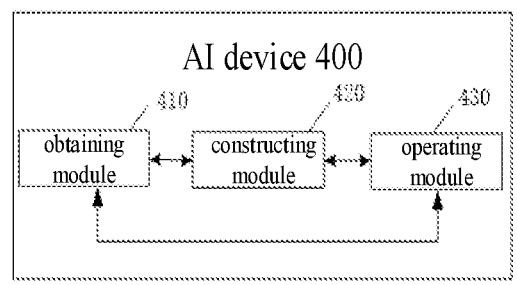
FIG. 4 is a block diagram of functional units of an AI device of a network off-line model provided by the embodiments of the present disclosure.

FIG. 4 is a possible block diagram of functional units of an AI device 400 of a network off-line model involved in the above-mentioned embodiments. The AI device 400 includes an obtaining module 410 and a constructing module 420.

The obtaining module 410 is configured to obtain the information of the operating unit of each sub-network in the network off-line model, where the information of the operating unit includes the correspondence between the sub-network and the type of the operating unit, and the type of the operating unit includes the general-purpose processing unit type or the AI processing unit type.

The constructing module 420 is configured to define the operating parameters of the sub-network according to the information of the operating unit when the network off-line model is being constructed to obtain the constructed network off-line model, where the operating parameters of the sub-network are used to represent the type of the operating unit of each sub-network.

The each sub-network includes the plurality of fused network layers; and the operating parameters of each sub-network include the name of the sub-network, the type of the operating unit, and the parameter information of the sub-network.

In a possible embodiment, the AI device 400 further includes an operating module 430, which is configured to operate the constructed network off-line model. The operating module 430 is specifically configured to:

determine the operating unit corresponding to a target sub-network according to the operating parameters of the sub-network, where the target sub-network is any sub-network of the network off-line model; and operate the target sub-network in the corresponding operating unit to operate the network off-line model.

In a possible embodiment, if the operating unit corresponding to the target sub-network is the AI processing unit, the operating module 430 is configured to determine the operating unit corresponding to the target sub-network according to the operating parameters of the sub-network, and the operating module 430 is specifically configured to:

obtain the model parallelism of the network off-line model; and determine the AI processing unit corresponding to the target sub-network according to the scheduling mechanism of the AI processing unit, the model parallelism, and the operating parameters of the sub-network.

In a possible embodiment, if the operating unit corresponding to the target sub-network is the AI processing unit, the operating module 430 is configured to operate the target sub-network on the corresponding operating unit to operate the network off-line model, wherein the operating module 430 is specifically configured to:

when the underlying library interface is being called, obtain a channel identifier transmitted from the underlying interface;

determine a channel of the AI processing unit for transmitting data according to the channel identifier; and operate the target sub-network on the AI processing unit through the channel to operate the network off-line model.

The embodiments of the present disclosure further provide a computer storage medium configured to store the computer programs. The processor may operate the computer program to implement the part or all steps of any one of the processing methods of the off-line model described in the above-mentioned embodiments.

The embodiments of the present disclosure further provide a computer program product which includes a non-transitory computer readable storage medium storing a computer program. By executing the computer program, the computing device can perform part or all steps of any one of the processing methods of the off-line model described in the above-mentioned embodiments.

It should be noted that, for the simplicity of description, the embodiments of the above-mentioned methods are all described as a combination of a series of actions. However, those skilled in the art should be aware that the disclosure is not limited by the described action order because according to the present disclosure, certain steps may be performed in another order or simultaneously. In addition, those skilled in the art should also be aware that the embodiments described in the specification are alternative embodiments and that the actions and modules involved are not necessary in the present disclosure. In the embodiments, the description of each embodiment has different emphasis. For the parts not described in detail in one embodiment, reference may be made to related descriptions in other embodiments.

In the embodiments of the disclosure, it should be understood that the device disclosed may be implemented in other manners. For example, the described device embodiments are merely illustrative; for instance, division of the unit is only a logical function division and can be divided in other manners during certain implementations, for example, a plurality of units or components may be combined or integrated into another system, or some features may be ignored, or not performed. In addition, coupling or direct coupling or communication connection between each illustrated or discussed component may be indirect coupling or communication connection through some interfaces, devices or units, and may be electrical connection or other forms of connection.

The units described as separate components may or may not be physically separated and the components illustrated as units may or may not be physical units, that is, the units or the components may be in the same place or may be distributed to a plurality of network units. All or part of the units may be selected according to actual needs to achieve the purpose of the technical solutions of the embodiments.

In addition, functional units in various embodiments of the present disclosure may be integrated into one processing unit, or each unit may be physically present, or two or more units may be integrated into one unit. The above-mentioned integrated unit can be implemented in the form of hardware or a software function unit.

The integrated unit may be stored in a computer-readable memory when it is implemented in the form of a software functional unit and is sold or used as a separate product. Based on such understanding, the technical solutions of the present disclosure essentially, or the part of the technical solutions that contributes to the related art, or all or part of the technical solutions, may be embodied in the form of a software product which is stored in a memory and includes instructions for causing a computer device (which may be a personal computer, a server, or a network device and so on) to perform all or part of the steps described in the various embodiments of the present disclosure. The memory includes various medium capable of storing program codes, such as a USB (universal serial bus) flash disk, a read-only memory (ROM), a random access memory (RAM), a removable hard disk, Disk, compact disc (CD), or the like.

It will be understood by those of ordinary skill in the art that all or a part of the various methods of the embodiments described above may be accomplished by means of a program to instruct associated hardware, and the program may be stored in a computer-readable memory, which may include a flash memory, a read-only memory (ROM), a random-access memory (RAM), a disk or a compact disc (CD), and the like.

The embodiments of the present disclosure are described in detail above and specific embodiments are used herein to describe the principle and implementation manners of the present disclosure. The description of the above embodiments is merely used to help understand the method and the core idea of the present disclosure. Meanwhile, those skilled in the art may make modifications to the specific implementation manners and the application scope according to the idea of the present disclosure. In summary, the contents of the specification should not be construed as limiting the present disclosure.

The invention claimed is:

1. A processing method of a network off-line model, comprising:
   obtaining information of an operating unit of each sub-network in the network off-line model, wherein the information of the operating unit includes a correspondence between the sub-network and a type of the operating unit, and the type of the operating unit includes a general-purpose processing unit type or an artificial intelligence (AI) processing unit type;
   defining operating parameters of the sub-network according to the information of the operating unit when the network off-line model is being constructed to obtain a constructed network off-line model, wherein the operating parameters of the sub-network are used to represent the type of the operating unit of each sub-network;
   operating the constructed network off-line model, which includes:
      determining the operating unit corresponding to a target sub-network according to the operating parameters of the sub-network, wherein the target sub-network is any sub-network of the network off-line model; and
      operating the target sub-network on the corresponding operating unit to operate the network off-line model
   wherein if the operating unit corresponding to the target sub-network is the AI processing unit, the operating the target sub-network on the corresponding operating unit to operate the network off-line model includes:
   when an underlying library interface is being called, obtaining a channel identifier transmitted from the underlying liability interface;
   determining a channel of the AI processing unit for transmitting data according to the channel identifier; and
      operating the target sub-network on the AI processing unit through the channel to operate the network off-line model.

2. The processing method of a network off-line model of claim 1, wherein each sub-network includes a plurality of fused network layers.

3. The processing method of network off-line model of claim 1, wherein the operating parameters of each sub-network include a name of the sub-network, the type of the operating unit, and parameter information of the sub-network.

4. The processing method of a network off-line model of claim 1, wherein if the operating unit corresponding to the target sub-network is an AI processing unit, the determining the operating unit corresponding to the target sub-network according to the operating parameters of the sub-network includes:
   obtaining a model parallelism of the network off-line model; and
   determining the AI processing unit corresponding to the target sub-network according to a scheduling mechanism of the AI processing unit, the model parallelism, and the operating parameters of the sub-network.

5. An artificial intelligence (AI) processing device, comprising:
   an obtaining module configured to obtain information of an operating unit of each sub-network in a network off-line model, where the information of the operating unit includes a correspondence between the sub-network and a type of the operating unit, and the type of the operating unit includes a general-purpose processing unit type or an AI processing unit type;
   a constructing module configured to define operating parameters of the sub-network according to the information of the operating unit when the network off-line model is being constructed to obtain a constructed network off-line model, wherein the operating parameters of the sub-network are used to represent the type of the operating unit of each sub-network;
   an operating module configured to operate the constructed network off-line model, wherein the operating module is configured to:
      determine the operating unit corresponding to a target sub-network according to the operating parameters of the sub-network, where the target sub-network is any sub-network of the network off-line model; and
      operate the target sub-network in the corresponding operating unit to operate the network off-line model,
   wherein if the operating unit corresponding to the target sub-network is an AI processing unit, the operating module is configured to operate the target sub-network on the corresponding operating unit to operate the network off-line model, wherein the operating module is configured to:
   when an underlying library interface is being called, obtain a channel identifier transmitted from the underlying liability interface;
   determine a channel of the AI processing unit for transmitting data according to the channel identifier; and
   operate the target sub-network on the AI processing unit through the channel to operate the network off-line model.

6. The AI processing device of claim 5, wherein each sub-network includes a plurality of fused network layers.

7. The AI processing device of claim 5, wherein the operating parameters of each sub-network include a name of the sub-network, the type of the operating unit, and parameter information of the sub-network.

8. The AI processing device of claim 5, wherein if the operating unit corresponding to the target sub-network is an AI processing unit, the operating module is configured to determine the operating unit corresponding to the target sub-network according to the operating parameters of the sub-network, wherein the operating module is configured to:
   obtain a model parallelism of the network off-line model; and
   determine the AI processing unit corresponding to the target sub-network according to a scheduling mechanism of the AI processing unit, the model parallelism, and the operating parameters of the sub-network.

* * * * *